(12) United States Patent
Miyoshi et al.

(10) Patent No.: US 8,853,829 B2
(45) Date of Patent: Oct. 7, 2014

(54) EPITAXIAL SUBSTRATE FOR SEMICONDUCTOR DEVICE, METHOD FOR MANUFACTURING EPITAXIAL SUBSTRATE FOR SEMICONDUCTOR DEVICE, AND SEMICONDUCTOR DEVICE

(71) Applicant: NGK Insulators, Ltd., Nagoya (JP)

(72) Inventors: Makoto Miyoshi, Inazawa (JP); Mikiya Ichimura, Ichinomiya (JP); Sota Maehara, Nagoya (JP); Mitsuhiro Tanaka, Tsukuba (JP)

(73) Assignee: NGK Insulators, Ltd, Nagoya (JP)

( * ) Notice: Subject to any disclaimer, the term of this patent is extended or adjusted under 35 U.S.C. 154(b) by 29 days.

(21) Appl. No.: 13/789,993

(22) Filed: Mar. 8, 2013

(65) Prior Publication Data

US 2013/0181327 A1 Jul. 18, 2013

Related U.S. Application Data

(63) Continuation of application No. PCT/JP2011/068743, filed on Aug. 19, 2011.

(30) Foreign Application Priority Data

Sep. 10, 2010 (JP) .................................. 2010-203062

(51) Int. Cl.
*H01L 29/20* (2006.01)
*H01L 21/20* (2006.01)
(Continued)

(52) U.S. Cl.
CPC .......... *H01L 29/0661* (2013.01); *C30B 29/403* (2013.01); *C30B 25/183* (2013.01);
(Continued)

(58) Field of Classification Search
CPC ........................ H01L 21/0262; H01L 21/0254
USPC .................................. 257/613, 615; 438/478
See application file for complete search history.

(56) References Cited

U.S. PATENT DOCUMENTS 6,255,004 B1 7/2001 Yoshida
2004/0232440 A1 11/2004 Ohtsuka et al.
(Continued)

FOREIGN PATENT DOCUMENTS

JP 09-275226 A1 10/1997
JP 10-163528 A1 6/1998
(Continued)

OTHER PUBLICATIONS

Toshihide Kikkawa, "*Highly Reliable 250 W High Electron Mobility Transistor Power Amplifier*," Japanese Journal of Applied Physics, vol. 44, No. 7A, 2005, pp. 4896-4901.
(Continued)

*Primary Examiner* — Fernando L. Toledo
*Assistant Examiner* — Neil Prasad
(74) *Attorney, Agent, or Firm* — Burr & Brown, PLLC

(57) ABSTRACT

Provided is a crack-free epitaxial substrate having a small amount of dislocations in which a silicon substrate is used as a base substrate. An epitaxial substrate includes a substrate made of (111) single crystal silicon and a base layer group in which a plurality of base layers are laminated. Each of the plurality of base layers includes a first group-III nitride layer made of AlN and a second group-III nitride layer made of $Al_{yy}Ga_{zz}N$ formed on the first group-III nitride layer. The first group-III nitride layer has many crystal defects. An interface between the first and second group-III nitride layers is a three-dimensional concavo-convex surface. In the base layer other than the base layer formed immediately above the base substrate, the first group-III nitride layer has a thickness of 50 nm or more and 100 nm or less and the second group-III nitride layer satisfies $0 \leq yy \leq 0.2$.

15 Claims, 3 Drawing Sheets

(51) Int. Cl.

| | | |
|---|---|---|
| *H01L 21/36* | (2006.01) | |
| *C30B 29/40* | (2006.01) | |
| *C30B 25/18* | (2006.01) | |
| *H01L 21/02* | (2006.01) | |
| *H01L 29/06* | (2006.01) | |
| *C30B 23/02* | (2006.01) | |
| *H01L 29/15* | (2006.01) | |
| *C23C 16/30* | (2006.01) | |

(52) U.S. Cl.
CPC .... *H01L 21/02516* (2013.01); *H01L 21/02381* (2013.01); *H01L 21/0262* (2013.01); *C30B 23/025* (2013.01); *H01L 29/2003* (2013.01); *H01L 29/155* (2013.01); *H01L 21/02458* (2013.01); *H01L 21/02365* (2013.01); *H01L 21/02507* (2013.01); *H01L 21/02439* (2013.01); *C23C 16/303* (2013.01); *H01L 21/02494* (2013.01); *H01L 21/02433* (2013.01); *H01L 21/0254* (2013.01)
USPC .......................................... 257/615; 438/478

(56) References Cited

U.S. PATENT DOCUMENTS

| | | |
|---|---|---|
| 2006/0191474 A1 | 8/2006 | Chen et al. |
| 2007/0164306 A1 | 7/2007 | Nakahata et al. |
| 2009/0200645 A1 | 8/2009 | Kokawa et al. |
| 2010/0078678 A1* | 4/2010 | Kokawa et al. ............... 257/183 |
| 2010/0207138 A1 | 8/2010 | Nakahata et al. |
| 2011/0198560 A1 | 8/2011 | Okagawa et al. |

FOREIGN PATENT DOCUMENTS

| | | |
|---|---|---|
| JP | 2000-311863 A1 | 11/2000 |
| JP | 2004-349387 A1 | 12/2004 |
| JP | 2005-350321 A1 | 12/2005 |
| JP | 2006-005331 A1 | 1/2006 |
| JP | 2009-289956 A1 | 12/2009 |
| WO | 2009/102033 A1 | 8/2009 |

OTHER PUBLICATIONS

Nariaki Ikeda, et al., "*High Power AlGaN/GaN HFET with a High Breakdown Voltage of Over 1.8kV on 4 inch Si Substrates and the Suppression of Current Collapse*," Proceedings of the 20th International Symposium on Power Semiconductor Devices & IC's, May 18-22, 2008, p. 287-290.

International Search Report dated Oct. 25, 2011 (with English translation).

William E. Fenwick et al., "*MOCVD Growth of GaN on Si(III) Substrates Using an ALD-Grown $Al_2O_3$ Interlayer*," Journal of Crystal Growth, vol. 311, No. 18, Sep. 1, 2009, pp. 4306-4310.

Extended European Search Report (Application No. 11823394.9) dated Jan. 23, 2014.

* cited by examiner

F I G . 2
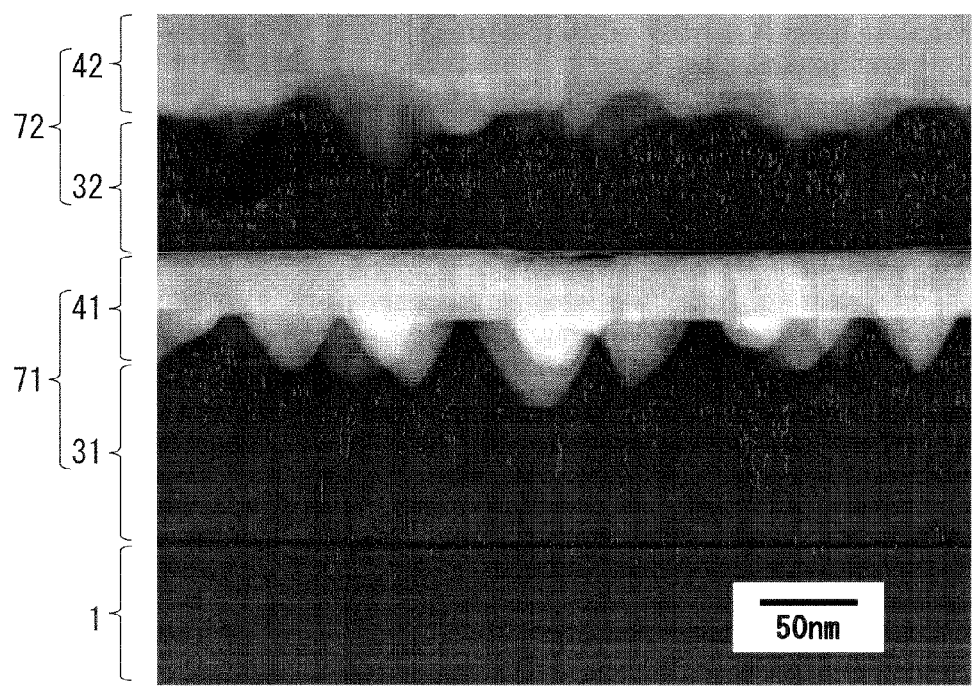

F I G . 3
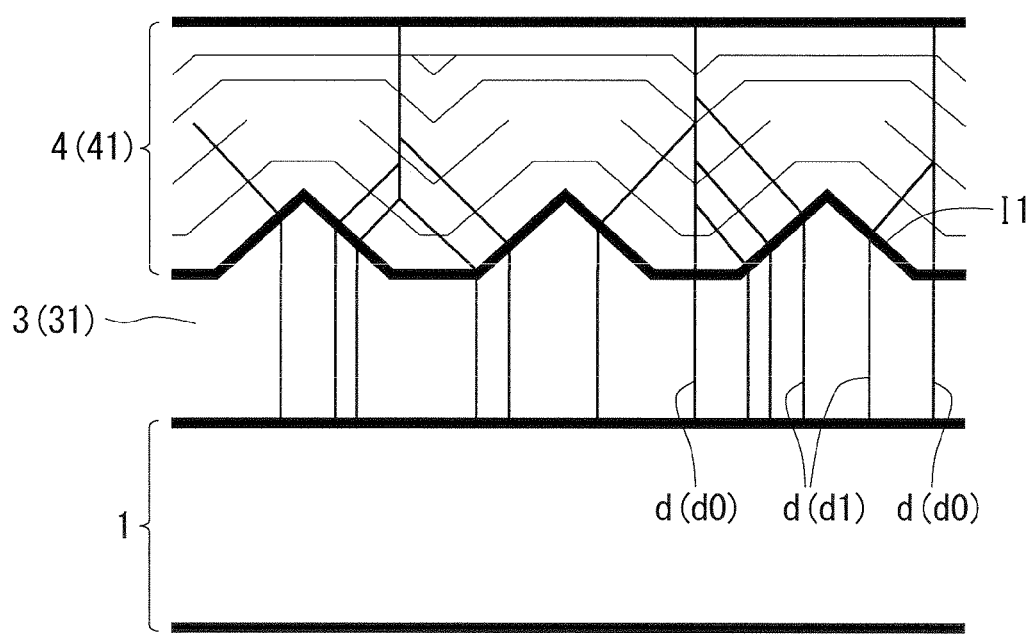

EPITAXIAL SUBSTRATE FOR SEMICONDUCTOR DEVICE, METHOD FOR MANUFACTURING EPITAXIAL SUBSTRATE FOR SEMICONDUCTOR DEVICE, AND SEMICONDUCTOR DEVICE

TECHNICAL FIELD

The present invention relates to an epitaxial substrate for use in a semiconductor device, and particularly to an epitaxial substrate made of a group-III nitride.

BACKGROUND ART

A nitride semiconductor is attracting attention as a semiconductor material for a light-emitting device such as a LED or a LD and for a high-frequency/high-power electronic device such as an HEMT, because the nitride semiconductor has a wide band gap of direct transition type and the breakdown electric field and the saturation electron velocity thereof are high. For example, an HEMT (high electron mobility transistor) device in which a barrier layer made of AlGaN and a channel layer made of GaN are laminated takes advantage of the feature that causes a high-concentration two-dimensional electron gas (2DEG) to occur in a lamination interface (hetero interface) due to the large polarization effect (a spontaneous polarization effect and a piezo polarization effect) specific to a nitride material (for example, see Non-Patent Document 1).

In some cases, a single crystal (a different kind single crystal) having a composition different from that of a group-III nitride, such as SiC, is used as a base substrate for use in a HEMT-device epitaxial substrate. In this case, a buffer layer such as a strained-superlattice layer or a low-temperature growth buffer layer is generally formed as an initially-grown layer on the base substrate. Accordingly, a configuration in which a barrier layer, a channel layer, and a buffer layer are epitaxially formed on a base substrate is the most basic configuration of the HEMT-device substrate including a base substrate made of a different kind single crystal. Additionally, a spacer layer having a thickness of about 1 nm may be sometimes provided between the barrier layer and the channel layer, for the purpose of facilitating a spatial confinement of the two-dimensional electron gas. The spacer layer is made of, for example, AlN. Moreover, a cap layer made of, for example, an n-type GaN layer or a superlattice layer may be sometimes formed on the barrier layer, for the purpose of controlling the energy level at the most superficial surface of the HEMT-device substrate and improving contact characteristics of contact with an electrode.

The HEMT device and the HEMT-device substrate involve various problems including problems concerning improvement of the performance such as increasing the power density and efficiency, problems concerning improvement of the functionality such as achievement of a normally-off operation, fundamental problems concerning a high reliability and cost reduction, and the like. Active efforts are made on each of the problems.

On the other hand, in the preparation of the above-mentioned nitride device, research and development have been made about the use of single crystal silicon for a base substrate for the purpose of reduction of the cost of an epitaxial substrate and furthermore for the purpose of integration with a silicon-based circuit device, and the like (for example, see Patent Documents 1 to 3, and Non-Patent Document 2). In a case where a conductive material such as silicon is selected as the base substrate of the HEMT-device epitaxial substrate, a field plate effect is applied from a back surface of the base substrate, and therefore a HEMT device can be designed for a high breakdown voltage and high-speed switching.

It is already known that, in order that the HEMT-device epitaxial substrate can be structured with a high breakdown voltage, it is effective to increase the total film thickness of the channel layer and the barrier layer and to improve the electrical breakdown strength of these layers (for example, see Non-Patent Document 2).

A method for manufacturing a semiconductor device is also known in which an interposed layer made of AlN is formed on a Si base substrate, then a first semiconductor layer made of GaN and a second semiconductor layer made of AlN are alternately formed so as to cause convex warping as a whole, and then these layers are made contract at a subsequent temperature drop, to result in cancellation of the warping of the entire substrate (for example, see Patent Document 4).

However, it is known that foiling a nitride film of good quality on a silicon substrate is very difficult as compared with a case of using a sapphire substrate or a SiC substrate, for the following reasons.

Firstly, the values of the lattice constants of silicon and a nitride material are greatly different from each other. This causes a misfit dislocation at an interface between the silicon substrate and a growth film, and facilitates a three-dimensional growth mode at a timing from the nucleus formation to the growth. In other words, this is a factor that hinders the formation of a good nitride epitaxial film having a low dislocation density and a flat surface.

Additionally, the nitride material has a higher thermal expansion coefficient value than that of silicon. Therefore, in the step of lowering the temperature to the vicinity of the room temperature after a nitride film is epitaxially grown on the silicon substrate at a high temperature, a tensile stress acts in the nitride film. As a result, it is likely that cracking occurs in a film surface and large warping occurs in the substrate.

Moreover, it is also known that trimethylgallium (TMG) that is a material gas of the nitride material for a vapor-phase growth is likely to form a liquid-phase compound with silicon, which is a factor that hinders the epitaxial growth.

In a case where the conventional techniques disclosed in the Patent Documents 1 to 3 and in the Non-Patent Document 1 are adopted, it is possible to cause an epitaxial growth of a GaN film on the silicon substrate. However, the resulting GaN film never has a better crystal quality as compared with a case of using SiC or sapphire for the base substrate. Therefore, preparing an electronic device such as a HEMT using the conventional techniques involves problems of a low electron mobility, a leakage current during the off-time, and a low breakdown voltage.

Furthermore, in the method disclosed in the Patent Document 4, large convex warping is intentionally caused in the course of preparation of the device. This may cause cracking in the course of the preparation of the device, depending on conditions under which the layers are formed.

PRIOR-ART DOCUMENTS

Patent Documents

Patent Document 1: Japanese Patent Application Laid-Open No. 10-163528 (1998)
Patent Document 2: Japanese Patent Application Laid-Open No. 2004-349387
Patent Document 3: Japanese Patent Application Laid-Open No. 2005-350321

Patent Document 4: Japanese Patent Application Laid-Open No. 2009-289956

Non-Patent Documents

Non-Patent Document 1: "Highly Reliable 250 W GaN High Electron Mobility Transistor Power Amplifier", Toshihide Kikkawa, Jpn. J. Appl. Phys. 44, (2005), pp. 4896-4901.

Non-Patent Document 2: "High power AlGaN/GaN HFET with a high breakdown voltage of over 1.8 kV on 4 inch Si substrates and the suppression of current collapse", Nariaki Ikeda, Syuusuke Kaya, Jiang Li, Yoshihiro Sato, Sadahiro Kato, Seikoh Yoshida, Proceedings of the 20th International Symposium on Power Semiconductor Devices & IC's May 18-22, 2008 Orlando, Fla., pp. 287-290

SUMMARY OF THE INVENTION

The present invention has been made in view of the problems described above, and an object of the present invention is to provide a crack-free epitaxial substrate having a small amount of dislocations in which a silicon substrate is used as a base substrate.

To solve the problems described above, a first aspect of the present invention is an epitaxial substrate for a semiconductor device, in which a group of group-III nitride layers are formed on a base substrate made of (111)-oriented single crystal silicon such that a (0001) crystal plane of the group of group-III nitride layers is substantially in parallel with a substrate surface of the base substrate. The epitaxial substrate includes: a base layer group formed on the base substrate, the base layer group including a plurality of base layers being repeatedly laminated, each of the plurality of base layers including a first group-III nitride layer made of AlN and a second group-III nitride layer made of $Al_{yy}Ga_{zz}N$ (yy+zz=1, 0≤yy<1, 0<zz≤1), the second group-III nitride layer being formed on the first group-III nitride layer; and at least one third group-III nitride layer that is epitaxially formed on the base layer group. The first group-III nitride layer is a layer with many crystal defects configured of at least one kind from a columnar or granular crystal or domain. An interface between the first group-III nitride layer and the second group-III nitride layer is a three-dimensional concavo-convex surface. When, among the plurality of base layers, the base layer formed immediately above the base substrate is defined as a first base layer and the base layer other than the first base layer is defined as a second base layer, the first group-III nitride layer included in the second base layer has a thickness of 50 nm or more and 100 nm or less and the second group-III nitride layer included in the second base layer is made of $Al_{yy}Ga_{zz}N$ (yy+zz=1, 0≤yy≤0.2, 0.8≤zz≤1).

A second aspect of the present invention is the epitaxial substrate for a semiconductor device according to the first aspect, wherein an amorphous interface layer is formed between the base substrate and the first base layer.

A third aspect of the present invention is the epitaxial substrate for a semiconductor device according to the second aspect, wherein the interface layer is made of $SiAl_xO_yN_z$.

A fourth aspect of the present invention is the epitaxial substrate for a semiconductor device according to the first or the second aspect, wherein the at least one third group-III nitride layer includes a superlattice structure layer in which two or more types of group-III nitride layers having different compositions are periodically laminated immediately above the base layer group.

A fifth aspect of the present invention is the epitaxial substrate for a semiconductor device according to the first or the second aspect, wherein the at least one third group-III nitride layer includes a function layer of a semiconductor device.

In a sixth aspect of the present invention, a semiconductor device, in which a group of group-III nitride layers are formed on a base substrate made of (111)-oriented single crystal silicon such that a (0001) crystal plane of the group of group-III nitride layers is substantially in parallel with a substrate surface of the base substrate. The semiconductor device includes: a base layer group formed on the base substrate, the base layer group including a plurality of base layers being repeatedly laminated, each of the plurality of base layers including a first group-III nitride layer made of AlN and a second group-III nitride layer made of $Al_{yy}Ga_{zz}N$ (yy+zz=1, 0≤yy<1, 0<zz≤1), the second group-III nitride layer being formed on the first group-III nitride layer; and at least one third group-III nitride layer that is epitaxially formed on the base layer group. The first group-III nitride layer is a layer with many crystal defects configured of at least one kind from a columnar or granular crystal or domain. An interface between the first group-III nitride layer and the second group-III nitride layer is a three-dimensional concavo-convex surface. When, among the plurality of base layers, the base layer formed immediately above the base substrate is defined as a first base layer and the base layer other than the first base layer is defined as a second base layer, the first group-III nitride layer included in the second base layer has a thickness of 50 nm or more and 100 nm or less and the second group-III nitride layer included in the second base layer is made of $Al_{yy}Ga_{zz}N$ (yy+zz=1, 0≤yy≤0.2, 0.8≤zz≤1).

A seventh aspect of the present invention is a method for manufacturing an epitaxial substrate for a semiconductor device in which a group of group-III nitride layers are formed on a base substrate made of (111)-oriented single crystal silicon such that a (0001) crystal plane of the group of group-III nitride layers is substantially in parallel with a substrate surface of the base substrate. The method includes: a base layer group formation step of forming a base layer group by repeatedly laminating a plurality of base layers on the base substrate, in which forming each of the plurality of base layers includes a first formation step of forming a first group-III nitride layer made of AlN and a second formation step of forming a second group-III nitride layer made of $Al_{yy}Ga_{zz}N$ (yy+zz=1, 0≤yy<1, 0<zz≤1) on the first group-III nitride layer; and a third formation step of epitaxially forming at least one third group-III nitride layer on the base layer group. In the first formation step, the first group-III nitride layer is formed as a layer with many crystal defects configured of at least one kind from a columnar or granular crystal or domain such that a surface of the first group-III nitride layer is a three-dimensional concavo-convex surface. When, among the plurality of base layers, the base layer formed immediately above the base substrate is defined as a first base layer and the base layer other than the first base layer is defined as a second base layer, the first group-III nitride layer included in the second base layer is formed with an average thickness of 50 nm or more and 100 nm or less under a pressure of 20 kPa or more, and the second group-III nitride layer included in the second base layer is made of $Al_{yy}Ga_{zz}N$ (yy+zz=1, 0≤yy≤0.2, 0.8≤zz≤1).

An eighth aspect of the present invention is the method for manufacturing an epitaxial substrate for a semiconductor device according to the seventh aspect, further including an interface layer formation step of forming an amorphous interface layer between the base substrate and the first base layer.

A ninth aspect of the present invention is the method for manufacturing an epitaxial substrate for a semiconductor device according to the eighth aspect, wherein the interface layer is made of $SiAl_xO_yN_z$.

A tenth aspect of the present invention is the method for manufacturing an epitaxial substrate for a semiconductor device according to the seventh or the eighth aspect, wherein the third formation step includes the step of periodically laminating two or more types of group-III nitride layers having different compositions immediately above the base layer group.

An eleventh aspect of the present invention is the method for manufacturing an epitaxial substrate for a semiconductor device according to the seventh or the eighth aspect, wherein the third formation step includes the step of forming a function layer of a semiconductor device.

In the first to eleventh aspects of the present invention, the first group-III nitride layer is provided as a layer with many crystal defects having inferior crystal properties. This relieves a lattice misfit in the epitaxial substrate, and thus an accumulation of strain energy caused by this misfit is suppressed. Additionally, since the interface between the first group-III nitride layer and the second group-III nitride layer is a three-dimensional concavo-convex surface, dislocations caused in the first group-III nitride layer are bent at the interface, and coalesce and disappear within the second group-III nitride layer. Accordingly, even in a case where a single crystal silicon substrate is used as the base substrate, a crack-free epitaxial substrate having a low dislocation density is achieved. As a result, use of such an epitaxial substrate allows a semiconductor device such as an HEMT to be provided at a lower cost as compared with use of a sapphire substrate or an SiC substrate.

BRIEF DESCRIPTION OF THE DRAWINGS

FIG. 2 A HAADF (High-angle Annular Dark Field) image of the epitaxial substrate 10.

FIG. 3 A diagram schematically showing disappearance of dislocations in the epitaxial substrate 10.

EMBODIMENT FOR CARRYING OUT THE INVENTION

<Outline Configuration of Epitaxial Substrate>

Figure 1:
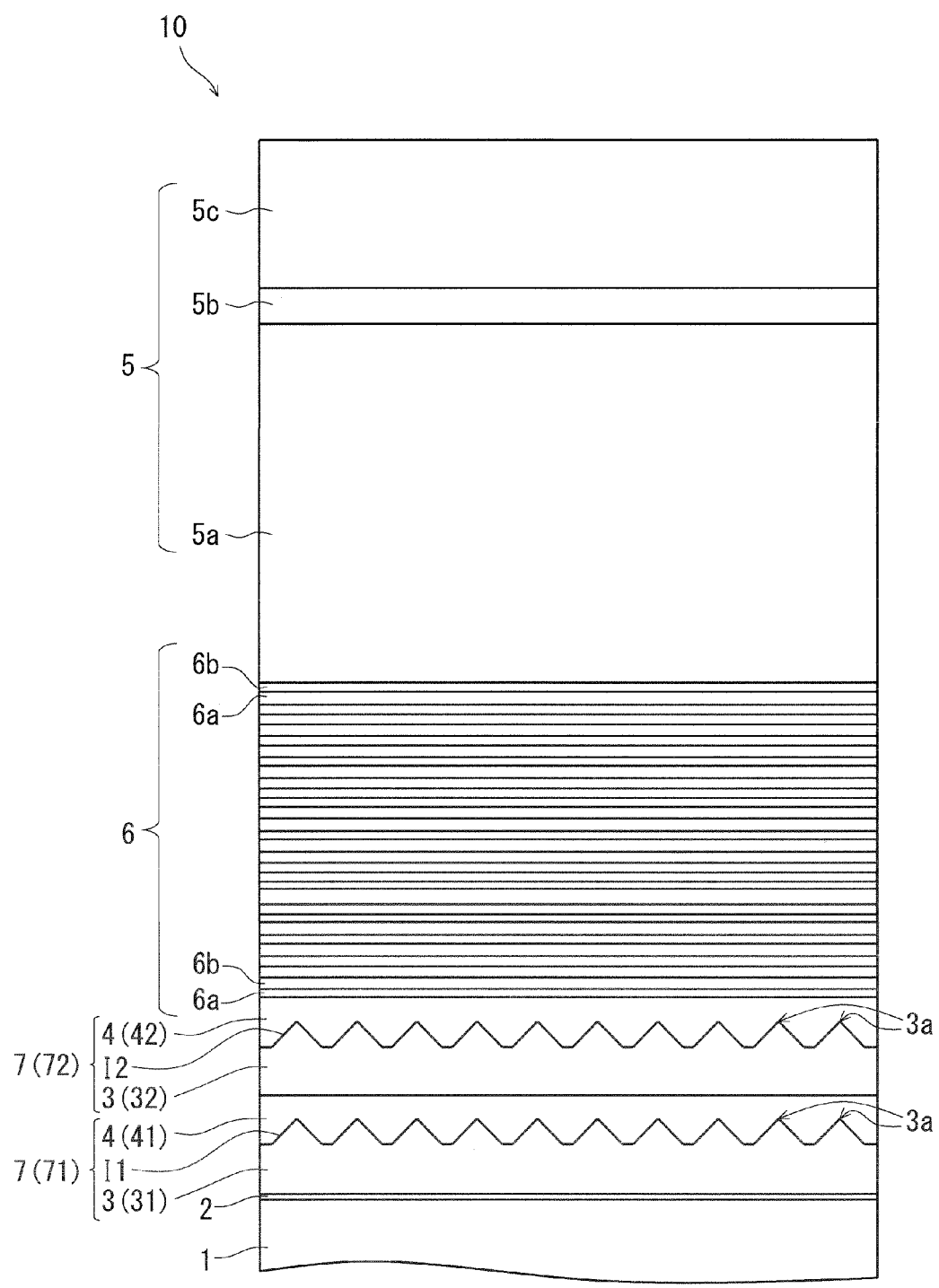
FIG. 1 A schematic cross-sectional view showing an outline configuration of an epitaxial substrate 10 according to an embodiment of the present invention.

FIG. 1 is a schematic cross-sectional view showing an outline configuration of an epitaxial substrate 10 according to an embodiment of the present invention.

The epitaxial substrate 10 mainly includes a base substrate 1, a plurality of base layers 7, and a function layer 5. In this embodiment, a description will be given mainly to a case where the base layer 7 of the epitaxial substrate 10 includes a first base layer 71 and a second base layer 72, as shown in FIG. 1. However, more base layers 7 may be laminated. A part of the epitaxial substrate 10 where the plurality of base layers 7 are laminated will be also referred to as a base layer group. The epitaxial substrate 10 may be configured such that, as shown in FIG. 1, an interface layer 2 is provided between the base substrate 1 and the first base layer 71 that is the lowermost base layer 7 and such that a superlattice structure layer 6 is provided between the base layer 7 and the function layer 5. The interface layer 2 and the superlattice structure layer 6 will be described later.

Each of the base layers 7 includes a concavo-convex layer 3 and a flattening layer 4. The concavo-convex layer 3 and the flattening layer 4 included in the first base layer 71 will be called a first concavo-convex layer 31 and a first flattening layer 41, respectively. The concavo-convex layer 3 and the flattening layer 4 included in the second base layer 72 will be called a second concavo-convex layer 32 and a second flattening layer 42, respectively.

The base substrate 1 is a single crystal silicon wafer of (111) plane. Although no particular limitation is put on the thickness of the base substrate 1, it is preferable to use the base substrate 1 having a thickness of several hundreds of μm to several mm, for convenience in handling in handling.

Each of the flattening layer 4 the function layer 5, and the superlattice structure layer 6 is a layer formed through an epitaxial growth process and made of a wurtzite-type group-III nitride such that its (0001) crystal plane is substantially in parallel with a substrate surface of the base substrate 1. In a preferred example, these layers are formed by a metalorganic chemical vapor deposition method (MOCVD process).

The concavo-convex layer 3 (the first concavo-convex layer 31 and the second concavo-convex layer 32) is a layer (first group-III nitride layer) made of AlN. More specifically, the concavo-convex layer 3 is configured of a large number of small columnar crystals or the like (at least one kind from columnar crystals, granular crystals, columnar domains, and granular domains) that have been grown in a direction (film formation direction) substantially perpendicular to the substrate surface of the base substrate 1. In other words, the concavo-convex layer 3 is a layer with many defects having inferior crystal properties, in which, although uniaxial orientation is achieved along a lamination direction of the epitaxial substrate 10, many crystal grain boundaries or dislocations exist along the lamination direction. Here, the amount of crystal grain boundaries is smaller in the second concavo-convex layer 32 formed on the first flattening layer 4 than in the first concavo-convex layer 31 formed immediately above the base substrate 1. In this embodiment, for convenience of the description, the crystal grain boundary is sometimes used as the term inclusive of domain grain boundaries and dislocations, too. In the concavo-convex layer 3, the interval of the crystal grain boundaries is at most about several tens of nm.

The first concavo-convex layer 31 is formed such that the half width of a (0002) X-ray rocking curve is 0.5 degrees or more and 1.1 degrees or less and such that the half width of a (10-10) X-ray rocking curve is 0.8 degrees or more and 1.1 degrees or less. The half width of the (0002) X-ray rocking curve serves as an index of the magnitude of mosaicity of a c-axis tilt component or the frequency of screw dislocations. The half width of the (10-10) X-ray rocking curve serves as an index of the magnitude of mosaicity of a crystal rotation component whose rotation axis is c-axis or the frequency of edge dislocations.

The flattening layer 4 (the first flattening layer 41 and the second flattening layer 42) is a layer (second group-III nitride layer) formed on the concavo-convex layer 3 and made of a group-III nitride that is represented by the compositional formula of $Al_{yy(i)}Ga_{zz(i)}N$ (yy(i)+zz(i)=1, 0≤yy(i)<1, 0<zz(i)≤1). Here, the subscript (i) means that it is a value of the i-th flattening layer 4. However, the second flattening layer 42 and flattening layers 4 formed thereon (that is, the flattening layers 4 that satisfy i≥2) are made of a group-III nitride within a composition range of 0≤yy(i)≤0.2.

The function layer 5 is at least one layer made of a group-III nitride. The function layer 5 is a layer that develops a predetermined function in the situation that predetermined semiconductor layers, electrodes, and the like, are additionally provided on the epitaxial substrate 10 to thereby form a semiconductor device. Accordingly, the function layer 5 is constituted of one or more layers having a composition and a thickness appropriate for this function.

<Detailed Configurations and Effects of Concavo-Convex Layer and Flattening Layer>

An interface I1 (a surface of the first concavo-convex layer 31) between the first concavo-convex layer 31 and the first flattening layer 41 and an interface I2 (a surface of the second concavo-convex layer 32) between the second concavo-convex layer 32 and the second flattening layer 42 are three-dimensional concavo-convex surfaces that reflect the outer shapes of the columnar crystals and the like included in the first concavo-convex layer 31 and the second concavo-convex layer 32, respectively. The fact that the interface I1 and the interface I2 have such a shape is clearly confirmed in, as illustrated in FIG. 2, a HAADF (High-angle Annular Dark Field) image of the epitaxial substrate 10. Here, the HAADF image is obtained by a scanning transmission electron microscope (STEM), and is a mapping image of the integrated intensity of electron that is inelastically scattered at a high angle. In the HAADF image, the image intensity is proportional to the square of an atomic number, and a portion where an atom having a greater atomic number exists is observed more brightly (more white).

In the epitaxial substrate 10, the concavo-convex layer 3 is made of AlN, while the flattening layer 4 is a layer containing at least Ga and thus having a composition different from the composition of AlN, as indicated by the aforesaid compositional formula. Since the atomic number of Ga is greater than the atomic number of Al, the flattening layer 4 is observed more brightly and the concavo-convex layer 3 is observed more darkly in FIG. 2. Therefore, in FIG. 2, it is easy to recognize that the interfaces I1 and I2 therebetween define three-dimensional concavo-convex surfaces.

In the cross-section schematically shown in FIG. 1, convex portions 3a of the concavo-convex layer 3 are located at substantially regular intervals. This is merely for convenience of illustration. Actually, the convex portions 3a are not necessarily located at regular intervals. Preferably, the concavo-convex layer 3 is formed such that the density of the convex portions 3a is $5 \times 10^9/cm^2$ or more and $5 \times 10^{10}/cm^2$ or less and the average interval of the convex portions 3a is 45 nm or more and 140 nm or less. When these ranges are satisfied, the function layer 5 having an especially excellent crystal quality can be formed. In this embodiment, the convex portion 3a of the concavo-convex layer 3 always denotes a position substantially at the apex of an upward convex portion of the surface (interfaces I1 and I2). From the results of experiments and observations conducted by the inventors of the present invention, it has been confirmed that a side wall of the convex portion 3a is formed by a (10-11) plane or (10-12) plane of AlN.

In order that the convex portions 3a that satisfy the above-mentioned density and average interval can be formed on the surface of the first concavo-convex layer 31, it is preferable to form the first concavo-convex layer 31 with an average film thickness of 40 nm or more and 200 nm or less. In a case where the average film thickness is less than 40 nm, it is difficult to achieve a state where the surface of the base substrate 1 is thoroughly covered with AlN while forming the above-described convex portions 3a. On the other hand, when the average film thickness exceeds 200 nm, flattening of an AlN surface starts to progress, to make it difficult to form the above-described convex portions 3a.

As for the second concavo-convex layer 32, it is preferable that the average film thickness is 50 nm or more and 100 nm or less. In a case where the average film thickness is less than 50 nm, it is difficult to achieve a state where the flattening layer 4 is directly and thoroughly covered with AlN, with forming the above-described convex portions 3a. On the other hand, when the average film thickness exceeds 100 nm, flattening of an AlN surface starts to progress, to make it difficult to form the above-described convex portions 3a.

The formation of the concavo-convex layer 3 is performed under predetermined epitaxial growth conditions. Here, forming the concavo-convex layer 3 with AlN is preferable in terms of not containing Ga which forms a liquid-phase compound with silicon and in terms of easily configuring the interfaces I1 and I2 as three-dimensional concavo-convex surfaces because a horizontal growth is relatively unlikely to progress.

In the epitaxial substrate 10 including the first base layer 71 (the first concavo-convex layer 31 and the first flattening layer 41) as described above, the first concavo-convex layer 31 that is a layer with many defects in which crystal grain boundaries exist is interposed between the base substrate 1 and the first flattening layer 41. This relieves a lattice misfit between the base substrate 1 and the first flattening layer 41, and thus an accumulation of strain energy caused by this lattice misfit is suppressed. Additionally, these effects of the relief of a lattice misfit and the suppression of an accumulation of strain energy are further enhanced by the second base layer 72 (the second concavo-convex layer 32 and the second flattening layer 42) being laminated on the first flattening layer 41. This is because providing the second base layer 72 in the epitaxial substrate 10 achieves a configuration in which the second concavo-convex layer 32 that is a layer with many defects is interposed between the first flattening layer 41 and the second flattening layer 42. As a result, the epitaxial substrate 10 that is crack-free and has a small residual stress and a small amount of warping, is achieved. The above-described ranges of the half widths of the (0002) and (10-10) X-ray rocking curves with respect to the first concavo-convex layer 31 are set as ranges that can suitably suppress the accumulation of strain energy by the crystal grain boundaries.

However, the interposition of the concavo-convex layer 3 causes an enormous number of dislocations originating from the crystal grain boundaries such as the columnar crystals of the concavo-convex layer 3 to propagate in the flattening layer 4 located immediately above the concavo-convex layer 3. This propagation of dislocations is particularly noticeable between the first concavo-convex layer 31, which is formed immediately above the base substrate 1 made of a different material, and the first flattening layer 41 located immediately above the first concavo-convex layer 31. In this embodiment, as described above, the interfaces I1 and I2 between the concavo-convex layer 3 and the flattening layer 4 are configured as three-dimensional concavo-convex surfaces, and thereby the dislocations are effectively reduced. FIG. 3 is a diagram schematically showing disappearance of dislocations in the epitaxial substrate 10, in which the vicinity of the interface I1 between the first concavo-convex layer 31 and the first flattening layer 41 is illustrated as an example. In FIG. 3, the interface layer 2 which will be described later is omitted.

Since the interface I1 between the first concavo-convex layer 31 and the first flattening layer 41 is configured as a three-dimensional concavo-convex surface, as shown in FIG. 3, most of dislocations d caused in the first concavo-convex layer 31 are bent at the interface I1 during the propagation (penetration) from the first concavo-convex layer 31 to the first flattening layer 41. To be more specific, dislocations d (d0) propagating through portions of the interface I1 that are substantially in parallel with the base substrate 1 can reach the upper side of the first flattening layer 41, while dislocations d (d1) propagating through portions of the interface I1 that are inclined relative to the base substrate 1 coalesce and disappear within the first flattening layer 41. As a result, only a small part of the dislocations originating from the first concavo-convex layer 31 penetrates through the first flattening layer 41 and propagates to the second concavo-convex layer 32 located immediately above the first flattening layer 41.

Furthermore, although dislocations originating from crystal grain boundaries also exist in the second concavo-convex layer 32, the number of crystal grain boundaries existing therein is small and therefore the number of dislocations is smaller than in the first concavo-convex layer 31. Therefore, the number of dislocations penetrating through the second concavo-convex layer 32 and propagating to the second flattening layer 42 is, though combined with the dislocations propagating from the first flattening layer 41, smaller than the dislocations existing in the first flattening layer 41. In the second flattening layer 42 as well, coalescence and disappearance of the dislocations occur by the same mechanism as that shown in FIG. 3. Accordingly, the number of dislocations penetrating through the second flattening layer 42 and propagating to a portion immediately above the second flattening layer 42 is still smaller. In a case where the base layer 7 is further formed on the second flattening layer 42, further exertion of the dislocation reduction effect is expected. That is, in the epitaxial substrate 10 according to this embodiment, the plurality of base layers 7 are provided and thereby upward propagation of the dislocations is suitably suppressed.

Preferably, as schematically shown in FIG. 3, although the first flattening layer 41 is formed along the shape of the surface of the first concavo-convex layer 31 in an initial stage of the growth, the surface thereof is gradually flattened along with the progress of the growth, and finally obtains a surface roughness of 10 nm or less. The same is true for the second flattening layer 42. In this embodiment, the surface roughness is expressed as an average roughness ra in a region of 5 μm×5 μm which has been measured by an AFM (atomic force microscope). Here, in terms of obtaining a good surface flatness of the flattening layer 4, it is preferable that the flattening layer 4 is made of a group-III nitride having a composition that contains at least Ga, which allows a horizontal growth to relatively easily progress.

It is preferable that the flattening layer 4 has an average thickness of 40 nm or more. This is because, when the average thickness is less than 40 nm, such problems arise in that concaves and convexes caused by the concavo-convex layer 3 cannot sufficiently be flattened, and in that the disappearance of dislocations having propagated to the flattening layer 4 by their coalescence with each other does not sufficiently occur. In a case where the average thickness is 40 nm or more, the reduction of the dislocation density and the flattening of the surface are effectively caused. Therefore, although, in a technical sense, no particular limitation is put on the upper limit of the thickness of the flattening layer 4, it is preferable that the thickness is about several μm or less from the viewpoint of the productivity.

The above-described manner of formation suitably reduces the dislocation density and achieves a good crystal quality, at least in the vicinity of the surface of the uppermost flattening layer 4 (second flattening layer 42) (in other words, at least in the vicinity of an interface with the function layer 5 or the superlattice structure layer 6). As a result, a good crystal quality is obtained in the function layer 5, too. Alternatively, depending on the compositions of the flattening layer 4 and the function layer 5 and the conditions under which the flattening layer 4 and the function layer 5 are formed, it is possible to form the function layer 5 with a smaller amount of dislocations than that of the flattening layer 4. For example, it is possible to form the function layer 5 having a small amount of dislocations, in which the dislocation density is about $2.5\times10^9/cm^2$ or less. The inventors of the present invention have confirmed that, in an epitaxial substrate in which only the first base layer 71 is provided and neither the second base layer 72 nor any additional base layer 7 is provided, the dislocation density is at least about $5\times10^9/cm^2$.

In a case where a group of group-III nitride layers having the same total film thickness is formed on a sapphire substrate or a SiC substrate with interposition of a low-temperature GaN buffer layer or the like through the MOCVD process, the value of the dislocation density is generally in the range from $5\times10^8$ to $1\times10^{10}/cm^2$. Thus, the aforementioned result indicates that an epitaxial substrate whose quality is equivalent to the quality of an epitaxial substrate obtained by using a sapphire substrate as the base substrate 1 can be achieved by using, as the base substrate 1, a single crystal silicon wafer which is more inexpensive than the sapphire substrate.

<Interface Layer>

As described above, in the epitaxial substrate 10, the interface layer 2 may be provided between the base substrate 1 and the first base layer 71 (and more specifically, between the base substrate 1 and the first concavo-convex layer 31). In one preferred example, the interface layer 2 has a thickness of about several nm and is made of amorphous $SiAl_xO_yN_z$.

In a case where the interface layer 2 is provided between the base substrate 1 and the first concavo-convex layer 31, a lattice misfit between the base substrate 1 and the first flattening layer 41, and the like, is more effectively relieved, and the crystal quality of each flattening layer 4 and the function layer 5 is further improved. That is, in a case where the interface layer 2 is provided, an AlN layer serving as the first concavo-convex layer 31 is formed such that the AlN layer has a shape with concaves and convexes similar to a case where the interface layer 2 is not provided and such that the amount of crystal grain boundaries existing therein is reduced as compared with the case where the interface layer 2 is not provided. Particularly, the first concavo-convex layer 31 having improvement in the half width value of the (0002) X-ray rocking curve is obtained. This is because, in a case where the first concavo-convex layer 3 is formed on the interface layer 2, nucleus formation of AlN, which will make the first concavo-convex layer 31, is less likely to progress than in a case where the first concavo-convex layer 31 is formed directly on the base substrate 1, and consequently the growth in the horizontal direction is promoted as compared with when the interface layer 2 is not provided. The film thickness of the interface layer 2 is to an extent not exceeding 5 nm. When this interface layer 2 is provided, the first concavo-convex layer 31 can be formed such that the half width of the (0002) X-ray rocking curve is in the range from 0.5 degrees or more and 0.8 degrees or less. In this case, the function layer 5 can be formed with a smaller amount of dislocations in which the dislocation density is about $1.5\times10^9/cm^2$ or less. The inventors of the present invention have confirmed that, in an epitaxial substrate including the interface layer 2 in which only the first base layer 71 is provided and neither the second base layer 72 nor any additional base layer 7 is provided, the dislocation density is at least about $3\times10^9/cm^2$.

Furthermore, in the formation of the first concavo-convex layer 31, at least one of Si atoms and O atoms may diffuse and form a solid solution in the first concavo-convex layer 31, or at least one of N atoms and O atoms may diffuse and form a solid solution in the base substrate 1.

<Superlattice Structure Layer>

As described above, the epitaxial substrate 10 may include the superlattice structure layer 6 provided between the flattening layer 4 and the function layer 5. In the example shown in FIG. 1, the superlattice structure layer 6 is formed of a first unit layer 6a and a second unit layer 6b that are two types of group-III nitride layers having different compositions being alternately and repeatedly laminated on the second flattening layer 42. Here, a pair of one first unit layer 6a and one second unit layer 6b will be also called a pair layer.

In the epitaxial substrate 10, a strain occurs in an in-plane direction of the flattening layer 4 because of a large difference between the value of the thermal expansion coefficient of the group-III nitride and the value of the thermal expansion coefficient of the single crystal silicon wafer of the base substrate 1. In this respect, the superlattice structure layer 6 has a function for relieving this strain and suppressing propagation of the strain to the function layer 5.

Although the superlattice structure layer 6 is not an essential component of the epitaxial substrate 10, providing the superlattice structure layer 6 exerts an effect of increasing the total film thickness of the group of group-III nitride layers of the epitaxial substrate 10 which results in an improved breakdown voltage of the semiconductor device. Even in a case where the superlattice structure layer 6 is interposed between the flattening layer 4 and the function layer 5, a sufficient crystal quality (to the same degree as when the superlattice structure layer 6 is not provided) is ensured in the function layer 5 as long as the formation conditions are suitably set.

As for the epitaxial substrate 10 for use in an HEMT device shown in FIG. 1, in a preferred example, the superlattice structure layer 6 is formed such that the first unit layer 6a is made of GaN and formed with a thickness of about several tens of nm and the second unit layer 6b is made of AlN and formed with a thickness of about several nm. In the example shown in FIG. 1, the pair layer is repeatedly formed fifteen times.

The function layer 5 is formed in the conditions that the pair layer has been repeatedly formed to such a degree that the strain existing in the flattening layer 4 is sufficiently released. This achieves the epitaxial substrate 10 in which occurrence of cracking and warping caused by a difference between the thermal expansion coefficients of the base substrate 1 and the group of group-III nitride layers is suitably suppressed. In other words, the superlattice structure layer 6 has a strain relief function for relieving propagation of a strain to the function layer 5 in the epitaxial substrate 10. In the epitaxial substrate 10 including such a superlattice structure layer 6, occurrence of cracking is suitably suppressed.

<Specific Aspect of Function Layer>

In FIG. 1, based on the assumption that the epitaxial substrate 10 is used as a substrate of an HEMT device, a case is illustrated where a channel layer 5a made of GaN with a high resistance, a spacer layer 5b made of AlN, and a barrier layer 5c made of AlGaN, InAlN, or the like, are formed as the function layer 5. It is preferable that the channel layer 5a is formed with a thickness of about several μm. It is preferable that the spacer layer 5b is formed with a thickness of about 1 nm. However, the spacer layer 5b is not an essential component in a configuration of an HEMT device. It is preferable that the barrier layer 5c is formed with a thickness of about several tens of nm. Such a layer configuration causes a two-dimensional electron gas region to occur in the vicinity of a hetero junction interface between the channel layer 5a and the barrier layer 5c (or the spacer layer 5b) due to a spontaneous polarization effect, a piezo polarization effect, or the like.

Alternatively, in a case where the epitaxial substrate 10 is used as a substrate of a Schottky diode, one group-III nitride layer (for example, a GaN layer) is formed as the function layer 5.

Alternatively, in a case where the epitaxial substrate 10 is used as a substrate of a light-emitting diode, an n-type nitride layer (for example, a GaN layer), a light-emitting layer made of an InAlGaN mixed crystal having a composition ratio that is appropriate for a targeted light emission wavelength, a p-type nitride layer (for example, a GaN layer), and the like, are formed as the function layer 5.

Use of the epitaxial substrate 10 having the above-described configuration can more inexpensively achieve a semiconductor device having the same degree of characteristics as those of a semiconductor device (such as a Schottky diode or an HEMT device) in which a group of group-III nitride layers are formed on a sapphire substrate or an SiC substrate.

For example, in a concentric type Schottky diode in which an anode and a cathode are arranged on the epitaxial substrate 10 having the function layer 5 made of GaN, a low leakage current and a high breakdown voltage are achieved.

In a case where the function layer 5 is configured with an AlGaN/GaN laminated structure for adaptation to application to an HEMT device, the function layer 5 having an excellent crystal quality and a high electron mobility is obtained.

<Method for Manufacturing Epitaxial Substrate>

Next, a method for manufacturing the epitaxial substrate 10 will be generally described by taking, as an example, a case of using an MOCVD process.

Firstly, a single crystal silicon wafer of (111) plane is prepared as the base substrate 1, and a natural oxide film is removed by dilute hydrofluoric acid cleaning. Then, SPM cleaning is performed to create a state where an oxide film having a thickness of about several Å is formed on a wafer surface. The resultant is set within a reactor of an MOCVD apparatus.

Then, each layer is formed under predetermined heating conditions and a predetermined gas atmosphere. Firstly, for the first concavo-convex layer 31 made of AlN, a substrate temperature is maintained at a predetermined concavo-convex layer formation temperature of 800° C. or higher and 1200° C. or lower, and the pressure in the reactor (also referred to as a growth pressure) is set to be about 0.1 to 30 kPa. In this state, a TMA (trimethylaluminum) bubbling gas that is an aluminum raw material and a $NH_3$ gas are introduced into the reactor with an appropriate molar flow ratio. A film formation speed is set to be 20 nm/min or higher. Thereby, the formation of the first concavo-convex layer 31 is achieved. The first concavo-convex layer 31 is formed such that the average film thickness thereof satisfies a range of 40 nm or more and 200 nm or less.

In a case where, after the silicon wafer reaches the concavo-convex layer formation temperature and before the first concavo-convex layer 31 is formed, only the TMA bubbling gas is introduced into the reactor to expose the wafer to a TMA bubbling gas atmosphere, the interface layer 2 made of $SiAl_xO_yN_z$ is formed.

For the formation of the first flattening layer 41, after the formation of the first concavo-convex layer 31, the substrate temperature is maintained at a predetermined flattening layer formation temperature of 800° C. or higher and 1200° C. or lower, and the pressure in the reactor is set to be 0.1 to 100 kPa. In this state, a TMG (trimethylgallium) bubbling gas that is a gallium raw material and a $NH_3$ gas, or additionally a TMA bubbling gas, are introduced into the reactor with a predetermined flow ratio that is appropriate for a composition of the first flattening layer 41 to be prepared. Thus, $NH_3$ is reacted with at least one of TMA and TMG. Thereby, the formation of the first flattening layer 41 is achieved.

For the formation of the second concavo-convex layer 32, the same procedures as for the formation of the first concavo-convex layer 31 are performed except that the pressure in the reactor is set to be 20 kPa or more and that the average film thickness satisfies a range of 50 nm or more and 100 nm or less. When the pressure in the reactor is set lower than 20 kPa, it is impossible to suitably form the second concavo-convex layer 32, because the interface 12 does not form a three-dimensional concavo-convex surface.

For the formation of the second flattening layer 42, the same formation conditions as for the formation of the first flattening layer 41 are set.

In a case of additionally laminating the concavo-convex layer 3 and the flattening layer 4 on the second flattening layer 42, the same formation conditions as for the formation of the second concavo-convex layer 32 and the second flattening layer 42 are set. This means that a base layer 7 formed on the second base layer 72 has substantially the same aspect as that of the second base layer 72. In other words, the epitaxial substrate 10 is configured such that at least one second base layer 72 is laminated on one first base layer 71.

For the formation of the superlattice structure layer 6, subsequent to the formation of the uppermost flattening layer 4, the substrate temperature is maintained at a predetermined superlattice structure layer formation temperature of 800° C. or higher and 1200° C. or lower, and the pressure in the reactor is set to be 0.1 to 100 kPa. In this state, the flow ratio between a $NH_3$ gas and a group-III nitride material gas (a bubbling gas of TMI (trimethylindium), TMA, TMG) that are introduced into the reactor is alternately varied in accordance with the compositions and the film thicknesses of the first unit layer 6a and the second unit layer 6b.

For the formation of the function layer 5, after the formation of the superlattice structure layer 6, the substrate temperature is maintained at a predetermined function layer formation temperature of 800° C. or higher and 1200° C. or lower, and the pressure in the reactor is set to be 0.1 to 100 kPa. In this state, at least one of a TMI bubbling gas, a TMA bubbling gas, and a TMG bubbling gas, and a $NH_3$ gas are introduced into the reactor with a flow ratio that is appropriate for a composition of the function layer 5 to be prepared. Thus, $NH_3$ is reacted with at least one of TMI, TMA, and TMG. Thereby, the formation of the function layer 5 is achieved. In a case where the function layer 5 is formed of a plurality of layers having different compositions as shown in FIG. 1, preparation conditions appropriate for each layer composition are applied.

EXAMPLES

Example 1

In this example, twelve types of epitaxial substrates 10 (specimen Nos. a-1 to a-12) were prepared which were different from one another in terms of the conditions under which the second base layer 72 was formed. Then, with respect to the function layer 5, an inspection of external appearance (inspection of whether or not cracking occurs) and an evaluation of the dislocation density were performed. To be specific, there were prepared an epitaxial substrate 10 (specimen No. a-1) including no second base layer 72 and eleven types of epitaxial substrates 10 (specimen Nos. a-2 to a-12) different from one another in terms of the thickness of the second concavo-convex layer 32, the pressure under which the second concavo-convex layer 32 was formed, and an Al mole fraction yy(2) in the second flattening layer 42. However, in any of the specimens, the formation of the interface layer 2 and the superlattice structure layer 6 was omitted. Table 1 shows the conditions under which the second base layer 72 (the second concavo-convex layer 32 and the second flattening layer 42) was formed and a result of the evaluation, which are specific to each of the specimens.

TABLE 1

| Specimen No. | Conditions under Which Second Concavo-Convex Layer was Formed | | Al Mole Fraction yy(2) in Second Flattening Layer | Result of Evaluation of Function Layer | |
|---|---|---|---|---|---|
| | Average Film Thickness (nm) | Growth Pressure (kPa) | | External Appearance (Presence or Absence of Cracking) | Dislocation Density (the Number of Dislocation/ $cm^2$) |
| a-1 | (No Second Base Layer was Formed) | | | Absence | 5.70E+09 |
| a-2 | 40 | 20 | 0.2 | Absence | 3.90E+19 |
| a-3 | 50 | 20 | 0.2 | Absence | 2.10E+09 |
| a-4 | 75 | 20 | 0.2 | Absence | 2.00E+09 |
| a-5 | 100 | 20 | 0.2 | Absence | 1.90E+09 |
| a-6 | 200 | 20 | 0.2 | Absence | 5.30E+19 |
| a-7 | 50 | 10 | 0.2 | Absence | 5.40E+19 |
| a-8 | 50 | 30 | 0.2 | Absence | 2.20E+09 |
| a-9 | 50 | 40 | 0.2 | Absence | 2.30E+09 |
| a-10 | 50 | 20 | 0.05 | Absence | 2.20E+09 |
| a-11 | 50 | 20 | 0.1 | Absence | 2.00E+09 |
| a-12 | 50 | 20 | 0.3 | Absence | 5.50E+19 |

Firstly, a single crystal silicon wafer (hereinafter, a silicon wafer of (111) plane having a diameter of four inches and a thickness of 525 μm was prepared as the base substrate 1. The prepared silicon wafer was subjected to dilute hydrofluoric acid cleaning using dilute hydrofluoric acid having a composition of hydrofluoric-acid/pure-water=1/10 (volume ratio), and subjected to SPM cleaning using cleaning liquid having a composition of sulfuric-acid/aqueous-hydrogen-peroxide=1/1 (volume ratio). Thus, a state was created in which an oxide film having a thickness of several Å was formed on the wafer surface, which was then set in a reactor of an MOCVD apparatus. Then, a hydrogen/nitrogen mixed atmosphere was created in the reactor, and heating was performed until the substrate temperature reached 1050° C. that is the concavo-convex layer formation temperature.

When the substrate temperature reached 1050° C., a $NH_3$ gas was introduced into the reactor, and the substrate surface was exposed to a $NH_3$ gas atmosphere for one minute.

Then, the pressure in the reactor was set to be 10 kPa, and a TMA bubbling gas was introduced into the reactor with a predetermined flow ratio, to react $NH_3$ with TMA, so that the first concavo-convex layer 31 whose surface had a three-dimensional concavo-convex shape was formed. At this time, the growing speed (film formation speed) of the first concavo-convex layer 31 was set to be 20 nm/min, and the target average film thickness of the first concavo-convex layer 31 was set to be 40 nm.

After the formation of the first concavo-convex layer 3, then the pressure in the reactor was set to be 20 kPa while the substrate temperature was kept at 1050° C. A TMG bubbling gas was further introduced into the reactor, to react $NH_3$ with TMA and TMG, so that an $Al_{0.3}Ga_{0.7}N$ layer serving as the first flattening layer 41 was formed with an average film thickness of about 50 nm.

After the formation of the first flattening layer 41, in all the specimens except the specimen (a-1) including no second base layer 72, the second concavo-convex layer 32 whose surface had a three-dimensional concavo-convex shape was formed under the same conditions as for the formation of the first concavo-convex layer 31, except that the target average film thickness and the pressure in the reactor were varied among the specimens. The target average film thickness was varied in four levels of 50 nm, 75 nm, 100 nm, and 200 nm. The pressure in the reactor was varied in four levels of 10 kPa, 20 kPa, 30 kPa, and 40 kPa. Then, the second flattening layer 42 was formed under the same preparation conditions as for the formation of the first flattening layer 41. Here, the value of the Al mole fraction yy(2) was varied in four levels of 0.05, 0.1, 0.2, and 0.3.

Then, the substrate temperature was set to be 1050° C., and the pressure in the reactor was set to be 30 kPa. Then, a reaction between TMG and $NH_3$ was caused, so that a GaN layer serving as the function layer 5 was formed with a thickness of 800 nm. Thereby, the respective epitaxial substrates 10 were obtained.

Each of the epitaxial substrates 10 thus obtained was inspected for its external appearance by a visual observation and by using a microscope, with a result that cracking in the GaN layer (function layer 5) was not observed in any of the specimens.

Additionally, each of the epitaxial substrates 10 was measured for the dislocation density in the GaN layer (function layer 5). As shown in Table 1, in the specimen a-1 including no second base layer 72, the dislocation density was $5.7 \times 10^9/cm^2$. In the specimens a-3 to a-5 and the specimens a-8 to a-11 among the specimens including the second base layer 72, the dislocation density was $1.9 \times 10^9/cm^2$ to $2.3 \times 10^9/cm^2$, which is about ½ of the dislocation density in the specimen a-1. On the other hand in the specimen a-2 whose second concavo-convex layer 32 had an average film thickness of 40 nm, the specimen a-6 whose second concavo-convex layer 32 had an average film thickness of 200 nm, the specimen a-7 whose second concavo-convex layer 32 was formed under a growth pressure of 10 kPa, and the specimen a-12 whose second flattening layer 42 had an Al mole fraction yy(2) of 0.3, the dislocation density was at least $3.9 \times 10^{19}/cm^2$, which is depart from the former by 10 orders or more.

Example 2

Twelve types of epitaxial substrates 10 (Specimens Nos. b-1 to b-12) were prepared under the same conditions and through the same procedures as in the example 1 except that the interface layer 2 was provided.

To be specific, at a time point when the substrate temperature reached 1050° C. that is the concavo-convex layer formation temperature, a $NH_3$ gas was introduced into the reactor, so that the substrate surface was exposed to a $NH_3$ gas atmosphere for one minute. Then, unlike the example 1, the feed of the $NH_3$ gas was once stopped, and instead a TMA bubbling gas was introduced into the reactor, so that the substrate surface was exposed to a TMA bubbling gas atmosphere for one minute. Then, a $NH_3$ gas was introduced into the reactor again, and subsequently the respective layers were formed in the same manner as in the example 1. Table 2 shows the conditions under which the second base layer 72 (the second concavo-convex layer 32 and the second flattening layer 42) was formed and a result of the evaluation, which are specific to each of the specimens.

TABLE 2

| Specimen No. | Conditions under Which Second Concavo-Convex Layer was Formed | | Al Mole Fraction yy(2) in Second Flattening Layer | Result of Evaluation of Function Layer | |
|---|---|---|---|---|---|
| | Average Film Thickness (nm) | Growth Pressure (kPa) | | External Appearance (Presence or Absence of Cracking) | Dislocation Density (the Number of Dislocation/ $cm^2$) |
| b-1 | (No Second Base Layer was Formed) | | | Absence | 2.90E+09 |
| b-2 | 40 | 20 | 0.2 | Absence | 2.80E+19 |

TABLE 2-continued

| Specimen No. | Conditions under Which Second Concavo-Convex Layer was Formed | | Al Mole Fraction yy(2) in Second Flattening Layer | Result of Evaluation of Function Layer | |
|---|---|---|---|---|---|
| | Average Film Thickness (nm) | Growth Pressure (kPa) | | External Appearance (Presence or Absence of Cracking) | Dislocation Density (the Number of Dislocation/ $cm^2$) |
| b-3 | 50 | 20 | 0.2 | Absence | 1.10E+09 |
| b-4 | 75 | 20 | 0.2 | Absence | 1.10E+09 |
| b-5 | 100 | 20 | 0.2 | Absence | 1.00E+09 |
| b-6 | 200 | 20 | 0.2 | Absence | 3.30E+19 |
| b-7 | 50 | 10 | 0.2 | Absence | 3.40E+19 |
| b-8 | 50 | 30 | 0.2 | Absence | 1.20E+09 |
| b-9 | 50 | 40 | 0.2 | Absence | 1.10E+09 |
| b-10 | 50 | 20 | 0.05 | Absence | 1.00E+09 |
| b-11 | 50 | 20 | 0.1 | Absence | 1.10E+09 |
| b-12 | 50 | 20 | 0.3 | Absence | 3.50E+19 |

The specimens in which the steps up to the formation of the first concavo-convex layer 31 had been performed were subjected to structure analysis by TEM and HAADF images, and further, subjected to SIMS (secondary ion mass spectrometry) and composition analysis with an EDS (energy dispersive X-ray spectrometer). As a result, it was confirmed that the amorphous interface layer 2 made of $SiAl_xO_yN_z$ (which will be also referred to simply as SiAlON) having a film thickness of about 3 nm was formed on the AlN/Si interface, that an AlN layer serving as the first concavo-convex layer 31 was deposited with a three-dimensional concavo-convex surface on the interface layer 2, that N and O diffused and formed a solid solution in the silicon wafer, and that Si and O diffused and formed a solid solution in the AlN layer.

Each of the epitaxial substrates 10 finally obtained was inspected for its external appearance by a visual observation and by using a microscope, with a result that cracking in the GaN layer (function layer 5) was not observed in any of the specimens.

Additionally, each of the epitaxial substrates 10 was measured for the dislocation density in the GaN layer (function layer 5). As shown in Table 2, in the specimen b-1 including no second base layer 72, the dislocation density was $2.9 \times 10^9/cm^2$. In the specimens b-3 to b-5 and specimens b-8 to b-11 whose second base layers 72 were formed under the same conditions as the conditions that achieved a low dislocation density in the example 1, the dislocation density was $1.0 \times 10^9/cm^2$ to $1.2 \times 10^9/cm^2$, which is about ⅓ of the dislocation density in the specimen b-1. On the other hand, in the specimens b-2, b-6, b-7, and b-12 whose second base layers 72 were formed under the same conditions as the conditions that resulted in a high dislocation density in the example 1, the dislocation density was at least $2.8 \times 10^{19}/cm^2$, which is depart from the former by 10 orders or more.

The results of the examples 1 and 2 indicate that forming the second concavo-convex layer 32 with an average film thickness of 50 nm or more and 100 nm or less and setting the Al mole fraction yy(2) in the second flattening layer 42 to be 0.2 or less can achieve the epitaxial substrate 10 having a function layer in which the dislocation density is suitably reduced, that the preparation of such an epitaxial substrate 10 can be achieved by setting the growth pressure under which the second concavo-convex layer 32 is formed to be 20 kPa or more, and that providing the interface layer 2 can further reduce the dislocation density.

The invention claimed is:

1. An epitaxial substrate for a semiconductor device, in which a group of group-III nitride layers are formed on a base substrate made of (111)-oriented single crystal silicon such that a (0001) crystal plane of said group of group-III nitride layers is substantially in parallel with a substrate surface of said base substrate, said epitaxial substrate comprising:
a base layer group formed on said base substrate, said base layer group including a plurality of base layers being repeatedly laminated, each of said plurality of base layers including a first group-III nitride layer made of AlN and a second group-III nitride layer made of $Al_{yy}Ga_{zz}N$ (yy+zz=1, 0≤yy<1, 0<zz≤1), said second group-III nitride layer being formed on said first group-III nitride layer; and
at least one third group-III nitride layer that is epitaxially formed on said base layer group,
wherein
said first group-III nitride layer is a layer with many crystal defects configured of at least one kind from a columnar or granular crystal or domain,
an interface between said first group-III nitride layer and said second group-III nitride layer is a three-dimensional concavo-convex surface,
when, among said plurality of base layers, the base layer formed immediately above said base substrate is defined as a first base layer and the base layer other than said first base layer is defined as a second base layer, said first group-III nitride layer included in said second base layer has a thickness of 50 nm or more and 100 nm or less and said second group-III nitride layer included in said second base layer is made of $Al_{yy}Ga_{zz}N$ (yy+zz=1, 0≤yy≤0.2, 0.8≤zz≤1).

2. The epitaxial substrate for a semiconductor device according to claim 1, wherein
an amorphous interface layer is formed between said base substrate and said first base layer.

3. The epitaxial substrate for a semiconductor device according to claim 2, wherein
said interface layer is made of $SiAl_xO_yN_z$.

4. The epitaxial substrate for a semiconductor device according to claim 1, wherein
said at least one third group-III nitride layer includes a superlattice structure layer in which two or more types of group-III nitride layers having different compositions are periodically laminated immediately above said base layer group.

5. The epitaxial substrate for a semiconductor device according to claim 1, wherein
said at least one third group-III nitride layer includes a function layer of a semiconductor device.

6. A semiconductor device in which a group of group-III nitride layers are formed on a base substrate made of (111)-oriented single crystal silicon such that a (0001) crystal plane of said group of group-III nitride layers is substantially in parallel with a substrate surface of said base substrate, said semiconductor device comprising:
a base layer group formed on said base substrate, said base layer group including a plurality of base layers being repeatedly laminated, each of said plurality of base layers including a first group-III nitride layer made of AlN and a second group-III nitride layer made of $Al_{yy}Ga_{zz}N$ (yy+zz=1, 0≤yy<1, 0<zz≤1), said second group-III nitride layer being formed on said first group-III nitride layer; and
at least one third group-III nitride layer that is epitaxially formed on said base layer group,
wherein
said first group-III nitride layer is a layer with many crystal defects configured of at least one kind from a columnar or granular crystal or domain,
an interface between said first group-III nitride layer and said second group-III nitride layer is a three-dimensional concavo-convex surface,
when, among said plurality of base layers, the base layer formed immediately above said base substrate is defined as a first base layer and the base layer other than said first base layer is defined as a second base layer, said first group-III nitride layer included in said second base layer has a thickness of 50 nm or more and 100 nm or less and said second group-III nitride layer included in said second base layer is made of $Al_{yy}Ga_{zz}N$ (yy+zz=1, 0≤yy≤0.2, 0.8≤zz≤1).

7. A method for manufacturing an epitaxial substrate for a semiconductor device in which a group of group-III nitride layers are formed on a base substrate made of (111)-oriented single crystal silicon such that a (0001) crystal plane of said group of group-III nitride layers is substantially in parallel with a substrate surface of said base substrate, said method comprising:
a base layer group formation step of forming a base layer group by repeatedly laminating a plurality of base layers on said base substrate, in which forming each of said plurality of base layers includes a first formation step of forming a first group-III nitride layer made of AlN and a second formation step of forming a second group-III nitride layer made of $Al_{yy}Ga_{zz}N$ (yy+zz=1, 0≤yy<1, 0<zz≤1) on said first group-III nitride layer; and
a third formation step of epitaxially foaming at least one third group-III nitride layer on said base layer group,
wherein
in said first formation step, said first group-III nitride layer is formed as a layer with many crystal defects configured of at least one kind from a columnar or granular crystal or domain such that a surface of said first group-III nitride layer is a three-dimensional concavo-convex surface,
when, among said plurality of base layers, the base layer formed immediately above said base substrate is defined as a first base layer and the base layer other than said first base layer is defined as a second base layer, said first group-III nitride layer included in said second base layer is formed with an average thickness of 50 nm or more and 100 nm or less under a pressure of 20 kPa or more, and said second group-III nitride layer included in said second base layer is made of $Al_{yy}Ga_{zz}N$ (yy+zz=1, 0≤yy≤0.2, 0.8≤zz≤1).

8. The method for manufacturing an epitaxial substrate for a semiconductor device according to claim 7, said method further comprising
an interface layer formation step of forming an amorphous interface layer between said base substrate and said first base layer.

9. The method for manufacturing an epitaxial substrate for a semiconductor device according to claim 8, wherein
said interface layer is made of $SiAl_xO_yN_z$.

10. The method for manufacturing an epitaxial substrate for a semiconductor device according to claim 7, wherein
said third formation step includes the step of periodically laminating two or more types of group-III nitride layers having different compositions immediately above said base layer group.

11. The method for manufacturing an epitaxial substrate for a semiconductor device according to claim 7, wherein said third formation step includes the step of forming a function layer of a semiconductor device.

12. The epitaxial substrate for a semiconductor device according to claim 2, wherein
said at least one third group-III nitride layer includes a superlattice structure layer in which two or more types of group-III nitride layers having different compositions are periodically laminated immediately above said base layer group.

13. The epitaxial substrate for a semiconductor device according to claim 2, wherein
said at least one third group-III nitride layer includes a function layer of a semiconductor device.

14. The method for manufacturing an epitaxial substrate for a semiconductor device according to claim 8, wherein
said third formation step includes the step of periodically laminating two or more types of group-III nitride layers having different compositions immediately above said base layer group.

15. The method for manufacturing an epitaxial substrate for a semiconductor device according to claim 8, wherein
said third formation step includes the step of forming a function layer of a semiconductor device.

* * * * *